United States Patent [19]
Hachiya et al.

[11] Patent Number: 6,069,501
[45] Date of Patent: May 30, 2000

[54] SEMICONDUCTOR DEVICE

[75] Inventors: Yoshiaki Hachiya, Otsu; Yuji Yamanishi, Ibaraki; Yoshihiro Mori, Kyoto, all of Japan

[73] Assignee: Matsushita Electronics Corporation, Osaka, Japan

[21] Appl. No.: 09/059,214

[22] Filed: Apr. 13, 1998

[30] Foreign Application Priority Data

Apr. 16, 1997 [JP] Japan ................................. 9-099201

[51] Int. Cl.[7] .................................................. H01L 35/00
[52] U.S. Cl. ............................................. 327/83; 327/513
[58] Field of Search ................................... 327/513, 512, 327/77, 83, 88, 89

[56] References Cited

U.S. PATENT DOCUMENTS

| | | | |
|---|---|---|---|
| 4,198,581 | 4/1980 | Ahmed | 327/83 |
| 4,746,823 | 5/1988 | Lee | 327/262 |
| 5,434,533 | 7/1995 | Furutani | 327/513 |
| 5,873,029 | 2/1999 | Grondahl et al. | 327/513 |

*Primary Examiner*—Toan Tran
*Attorney, Agent, or Firm*—Renner, Otto, Boisselle & Sklar

[57] ABSTRACT

A semiconductor device of the present invention includes a comparator including a detection side circuit to which a detection voltage is supplied and a reference side circuit to which a reference voltage is supplied. A detection element for obtaining the detection voltage is provided inside the semiconductor device, and a reference element for obtaining the reference voltage is provided outside the semiconductor device. At least one of the detection side circuit and the reference side circuit includes a temperature dependent adjustment element for reducing a difference between a temperature characteristic of the detection voltage and a temperature characteristic of the reference voltage.

8 Claims, 7 Drawing Sheets

SEMICONDUCTOR DEVICE

BACKGROUND OF THE INVENTION

1. Field of the Invention

The present invention relates to a semiconductor device. More particularly, the present invention relates to a circuit technique for reducing fluctuations in the output characteristic of a comparator due to temperature changes, in a semiconductor device including a power element and a comparator integrated in the same semiconductor substrate, where a detection voltage is obtained from a semiconductor element which is provided on the substrate and has significant fluctuation in the temperature characteristic thereof while a reference voltage is obtained from an external component which has insignificant fluctuation in the temperature characteristic thereof.

2. Description of the Related Art

In order to suppress the fluctuations in the output characteristic of a comparator due to temperature changes, the temperature characteristic of an element for obtaining a detection voltage (hereinafter, referred to simply as "detection element") and that of an element for obtaining a reference voltage (hereinafter, referred to simply as "reference element") should be considered together.

To do so in a semiconductor device with a comparator provided therein, for example, it is typical to provide both the detection element and the reference element on a semiconductor substrate, or to provide both of the elements as external components. In the former case where both of the elements are provided on a semiconductor substrate, the output characteristic of the comparator is stable against temperature changes but is also fixed, whereby a user cannot arbitrarily set the output characteristic of the comparator. In the latter case where both of the elements are provided as external components, although the user can arbitrarily set the output characteristic of the comparator, two additional external connection terminals are required for each comparator, thereby increasing the number of external terminals required in the semiconductor device.

In order to reduce the size of the semiconductor device and the number of the external terminals, while allowing for the arbitrary setting of the output characteristic of the comparator, it is necessary to obtain the reference voltage of the comparator from an externally provided component.

FIG. 7 illustrates a conventional example where the reference voltage of a comparator is obtained from an externally provided component. In FIG. 7, a semiconductor device 1 includes a comparator 2 and a detection element 3, which is a semiconductor element, both provided on a semiconductor substrate. Reference numeral 4 denotes an external connection terminal, and 5 denotes an output terminal of the comparator 2. A constant current source 6 and an externally provided resistor 7 for obtaining a reference voltage (hereinafter, "external reference resistor 7") are connected to the external connection terminal 4.

The comparator 2 includes a detection side circuit, a reference side circuit and a constant current source 16. The detection side circuit includes a constant current source 8, a transistor 10 and a transistor 11. The reference side circuit includes a constant current source 12, a transistor 14 and a transistor 15. The transistors 10 and 14 are each called a "buffer element", and the transistors 11 and 15 are each called a "differential element".

The reference voltage of the comparator 2 is a voltage generated at the external reference resistor 7, and the detection voltage of the comparator 2 is a voltage generated at the detection resistor 3. The reference terminal of the comparator 2 is provided as an external connection terminal so that the output characteristic of the comparator 2 can be set arbitrarily by setting the reference voltage to be generated at the external reference resistor 7.

However, in the comparator 2 illustrated in FIG. 7, the reference voltage of the comparator 2 is a voltage generated at the external reference resistor 7. Since the external reference resistor 7 is an externally provided element, the fluctuation of the reference voltage due to temperature changes is insignificant. On the other hand, the detection voltage of the comparator 2 is a voltage generated at the detection resistor 3. Since the detection resistor 3 is provided on the semiconductor substrate, the fluctuation of the detection voltage due to temperature changes may be significant. Therefore, there may be a difference in temperature characteristic between the detection voltage and the reference voltage of the comparator 2, whereby the output characteristic of the comparator 2 fluctuates due to temperature changes. Particularly, when a power element is provided on the semiconductor substrate, the fluctuation of the detection resistor 3 due to temperature changes is further increased by heat generated by the power element, whereby the output characteristic of the comparator significantly fluctuates due to temperature changes.

SUMMARY OF THE INVENTION

The semiconductor device of the present invention includes a temperature dependent adjustment element provided in at least one of the detection side circuit or the reference side circuit of the comparator so as to match with each other the respective temperature characteristics of the detection voltage and the reference voltage of the comparator.

The detection side circuit and the reference side circuit are each provided with a temperature dependent adjustment element. A temperature dependent semiconductor element such as a diode may be used as the temperature dependent adjustment element in the detection side circuit. A temperature dependent semiconductor element such as a resistor element may be used as the temperature dependent adjustment element in the reference side circuit.

When a diode is provided in the detection side circuit, the rectifying characteristic of the diode is reduced as the temperature increases, whereby the fluctuations in detection voltage due to temperature changes is reduced, thereby reducing the temperature characteristic difference between the detection voltage and the reference voltage in the comparator.

Moreover, when a resistor element is provided in the reference side circuit, the resistance value thereof increases as the temperature increases, whereby the fluctuations in reference voltage due to temperature changes increases, thereby reducing the temperature characteristic difference between the detection voltage and the reference voltage.

When a diode is provided in the detection side circuit while a resistor element is provided in the reference side circuit, the temperature characteristic difference between the detection voltage and the reference voltage in the comparator is reduced more effectively.

According to one aspect of this invention, a semiconductor device includes a comparator including a detection side circuit to which a detection voltage is supplied and a reference side circuit to which a reference voltage is supplied. A detection element for obtaining the detection voltage is provided inside the semiconductor device, and a reference element for obtaining the reference voltage is provided outside the semiconductor device. At least one of the detection side circuit and the reference side circuit includes a temperature dependent adjustment element for reducing a difference between a temperature characteristic of the detection voltage and a temperature characteristic of the reference voltage.

In one embodiment of the invention, the detection side circuit includes a first buffer element and a first differential element, and the reference side circuit includes a second buffer element and a second differential element. The temperature dependent adjustment element is provided between the first buffer element and the first differential element or between the second buffer element and the second differential element.

In another embodiment of the invention, the detection side circuit includes the temperature dependent adjustment element, the temperature dependent adjustment element having a characteristic such that a voltage between opposite ends of the temperature dependent adjustment element decreases as temperature increases.

In still another embodiment of the invention, the temperature dependent adjustment element is a diode.

In still another embodiment of the invention, the reference side circuit includes the temperature dependent adjustment element, the temperature dependent adjustment element having a characteristic such that a voltage between opposite ends of the temperature dependent adjustment element increases as temperature increases.

In still another embodiment of the invention, the temperature dependent adjustment element is a resistor element.

In still another embodiment of the invention, the semiconductor device further includes a power element, and the detection side circuit further includes a detection circuit for detecting an excess current or heat generation of the power element.

In still another embodiment of the invention, the reference element is provided outside the semiconductor device so that an output characteristic of the comparator is variable.

Thus, the invention described herein makes possible the advantage of providing a semiconductor device with a reduced difference in temperature characteristic between a detection voltage and a reference voltage in a comparator where the detection voltage is obtained from a detection element provided on the semiconductor substrate and the reference voltage is obtained from an externally provided reference element. The invention is particularly effective in a semiconductor device where a power element is integrated with the comparator.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described in detail by way of illustrative examples with reference to the accompanying figures.

EXAMPLE 1

Figure 1:
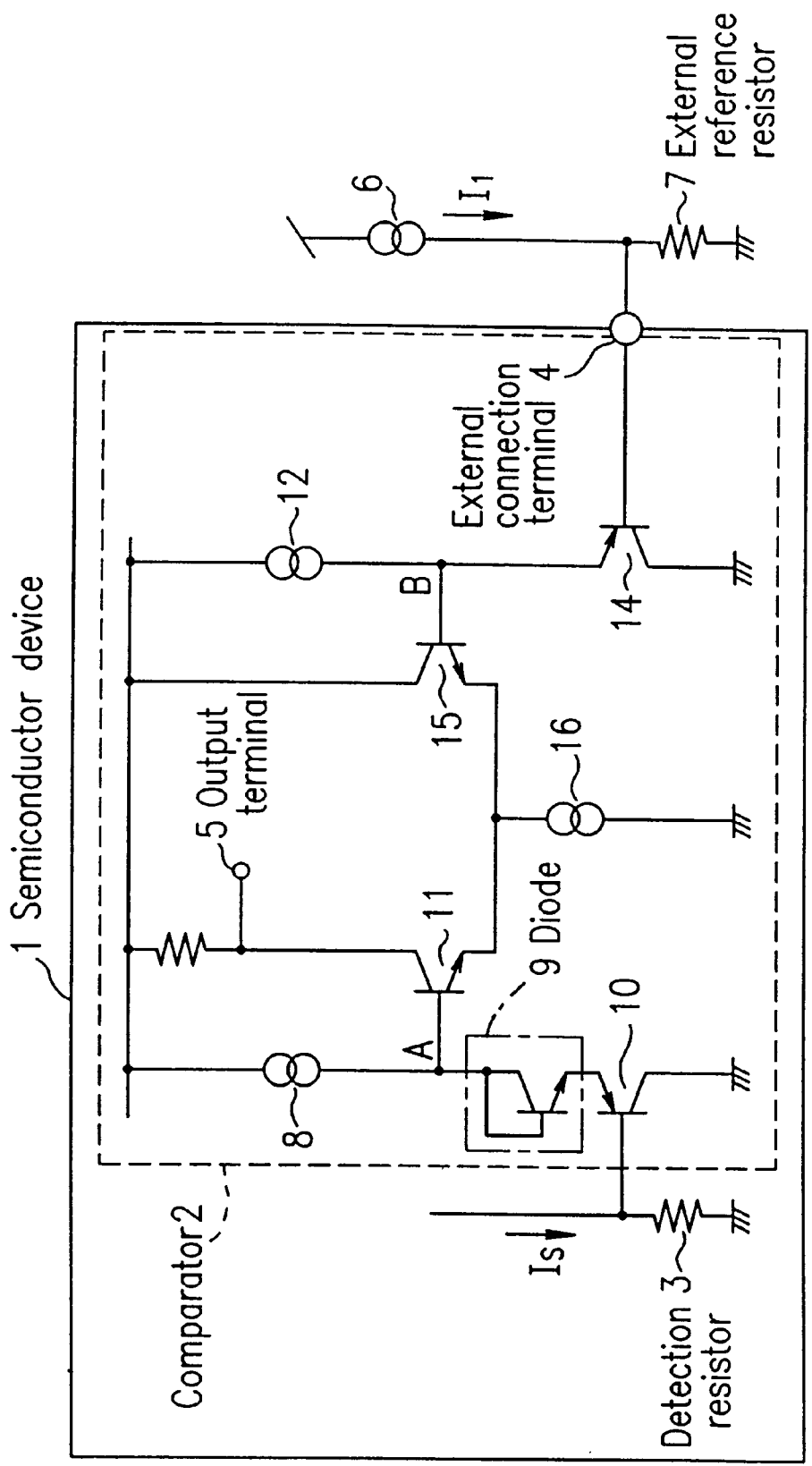
FIG. 1 is a circuit diagram of a semiconductor device according to Example 1 of the present invention.
Figure 7:
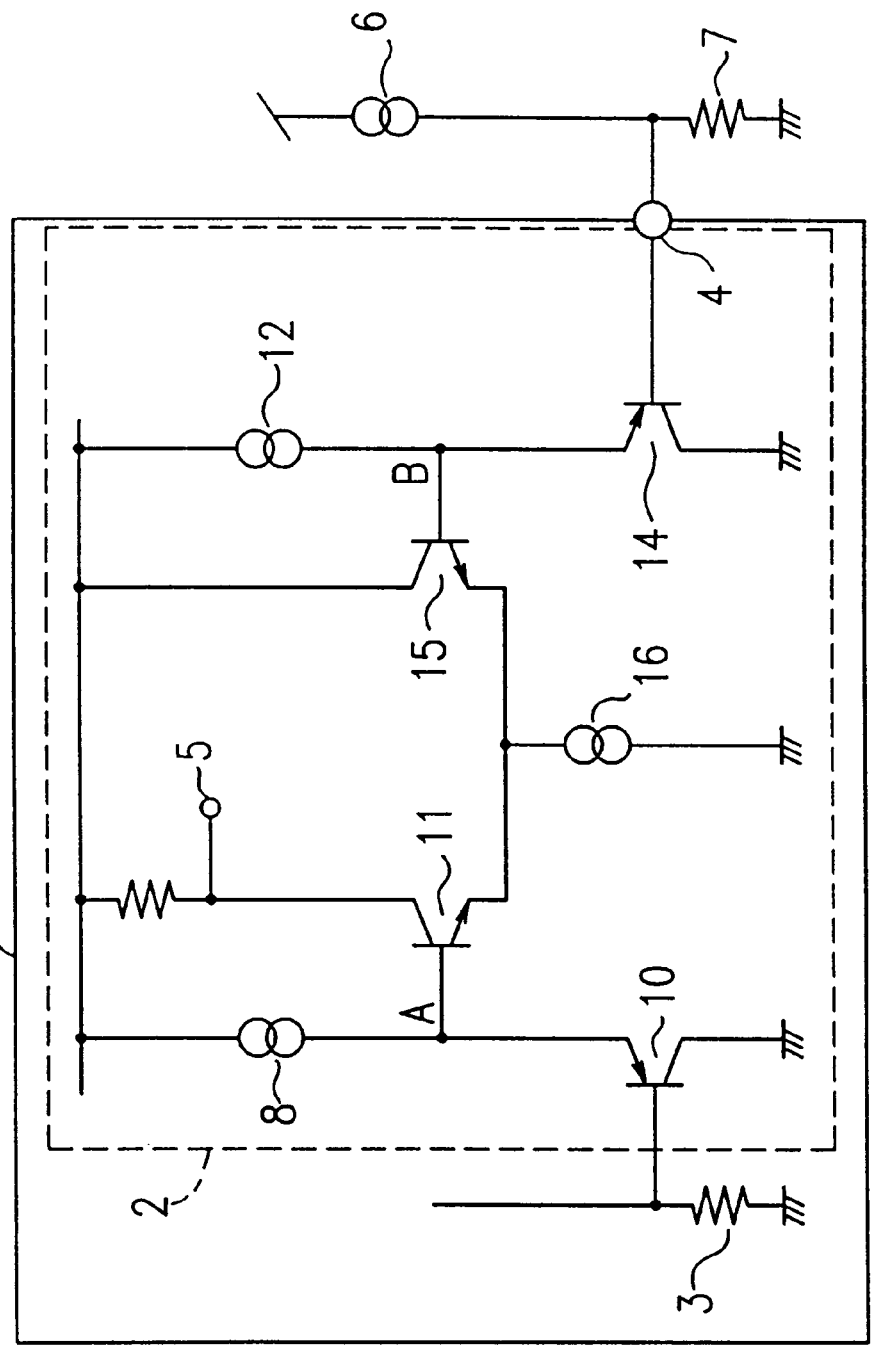
FIG. 7 is a circuit diagram of a conventional semiconductor device.

FIG. 1 illustrates a semiconductor device according to Example 1 of the present invention. In FIG. 1, elements which are illustrated in FIG. 7 are denoted by the same reference numerals.

The detection side circuit includes a constant current source 8, a transistor 10 and a transistor 11. The transistor 10 functions as a "buffer element" and the transistor 11 functions as a "differential element".

Reference numeral 9 denotes a diode as a temperature dependent adjustment element provided in the detection side circuit of the comparator 2 to which a detection voltage is supplied.

The diode 9 is serially connected to the transistor 10 as a switching element. The diode 9 is provided between the buffer element 10 and the differential element 11. The diode 9 has a temperature characteristic such that the voltage between the opposite ends thereof decreases as the temperature increases.

Hereinafter, the present example will be described in greater detail.

In FIG. 1, the electric current of the constant current source 6 is denoted by $I_1$.

The base-emitter voltage and the temperature coefficient of each of the transistors 10, 11, 14 and 15 and the diode 9 are denoted by $V_F$ and $-\Delta\alpha$, respectively. The temperature coefficient of the detection resistor 3 is denoted by $\Delta\beta$.

Since the temperature dependency of the external reference resistor 7 is lower than that of the detection resistor 3, the temperature coefficient of the external reference resistor 7 is assumed to be zero.

At the time when the respective voltages at points A and B in the comparator 2 are equal to each other and the output of the output terminal 5 changes from "H" to "L", the resistance value of the detection resistor 3 is denoted by $R_3$; the detection current flowing through the detection resistor 3 is denoted by Is; and the resistance value of the external reference resistor 7 is denoted by $R_7$.

Then, the respective voltages $V_a$ and $V_b$ at points A and B can be expressed as follows.

Expression 1

$$V_a = Is \cdot (1+\Delta\beta)R_3 + 2(1-\Delta\alpha)V_F$$

Expression 2

$$V_b = I_1 \cdot R_7 + (1-\Delta\alpha)V_F$$

From Expressions 1 and 2, the detection current Is can be expressed as follows.

Expression 3

$$Is = \{I_1 \cdot R_7 - (1-\Delta\alpha)V_F\} / \{(1+\Delta\beta)R_3\}$$

As the temperature increases, the denominator $(1+\Delta\beta)R_3$ in the right side in Expression 3 increases, and $(1-\Delta\alpha)V_F$ in the numerator in the right side decreases while the numerator in the right side as a whole increases. As a result, the deviation in the detection current Is due to increasing temperature is reduced.

EXAMPLE 2

Figure 2:
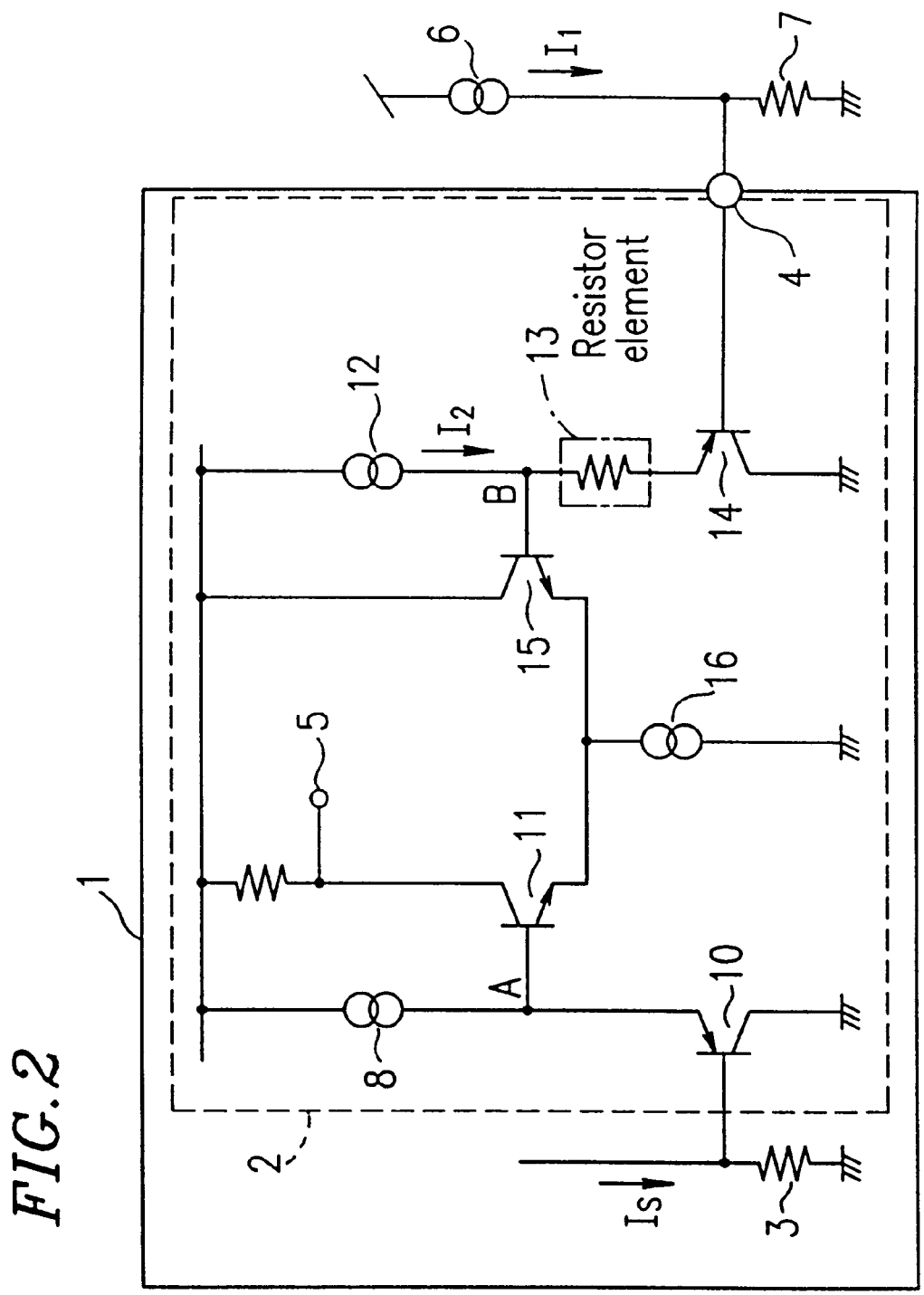
FIG. 2 is a circuit diagram of a semiconductor device according to Example 2 of the present invention.

FIG. 2 illustrates a semiconductor device according to Example 2 of the present invention.

Instead of the diode 9 in FIG. 1, a resistor element 13 is provided in the reference side circuit of the comparator 2 to which a reference voltage is supplied.

The reference side circuit includes a constant current source 12, a transistor 14 and a transistor 15. The transistor 14 functions as a "buffer element" and the transistor 15 functions as a "differential element".

The resistor element 13 is serially connected to the transistor 14 as a switching element. The resistor element 13 is provided between the buffer element 14 and the differential element 15. The resistor element 13 is a temperature dependent adjustment element whose resistance value increases as the temperature increases so that the voltage between the opposite ends thereof increases.

In FIG. 2, as in Example 1, the electric current of the constant current source 6 is denoted by $I_1$.

The base-emitter voltage and the temperature coefficient of each of the transistors 10, 11, 14 and 15 are denoted by $V_F$ and $-\Delta\alpha$, respectively; and the temperature coefficient of each of the detection resistor 3 and the resistor 13 is denoted by $\Delta\beta$.

Since the temperature dependency of the external reference resistor 7 is lower than that of the detection resistor 3, the temperature coefficient of the external reference resistor 7 is assumed to be zero.

At the time when the respective voltages at points A and B in the comparator 2 are equal to each other and the output of the output terminal 5 changes from "H" to "L", the resistance value of the detection resistor 3 is denoted by $R_3$; the detection current flowing through the detection resistor 3 is denoted by Is; the electric current of the constant current source 12 is denoted by $I_2$; the resistance value of the external reference resistor 7 is denoted by $R_7$; and the resistance value of the external reference resistor 13 is denoted by $R_{13}$.

Then, the respective voltages $V_a$ and $V_b$ at points A and B can be expressed as follows.

Expression 4

$$V_a = Is \cdot (1+\Delta\beta)R_3 + (1-\Delta\alpha)V_F$$

Expression 5

$$V_b = I_1 \cdot R_7 + (1-\Delta\alpha)V_F + I_2 \cdot (1+\Delta\beta)R_{13}$$

From Expressions 4 and 5, the detection current Is can be expressed as follows.

Expression 6

$$Is = \{I_1 \cdot R_7 + I_2 \cdot (1+\Delta\beta)R_{13}\} / \{(1+\Delta\beta)R_3\}$$

As the temperature increases, the denominator $(1+\Delta\beta)R_3$ in the right side in Expression 6 increases, and $I_2 \cdot (1+\Delta\beta)R_{13}$ in the numerator in the right side also increases while the numerator in the right side as a whole also increases. As a result, the deviation in the detection current Is due to increasing temperature is reduced.

EXAMPLE 3

Figure 3:
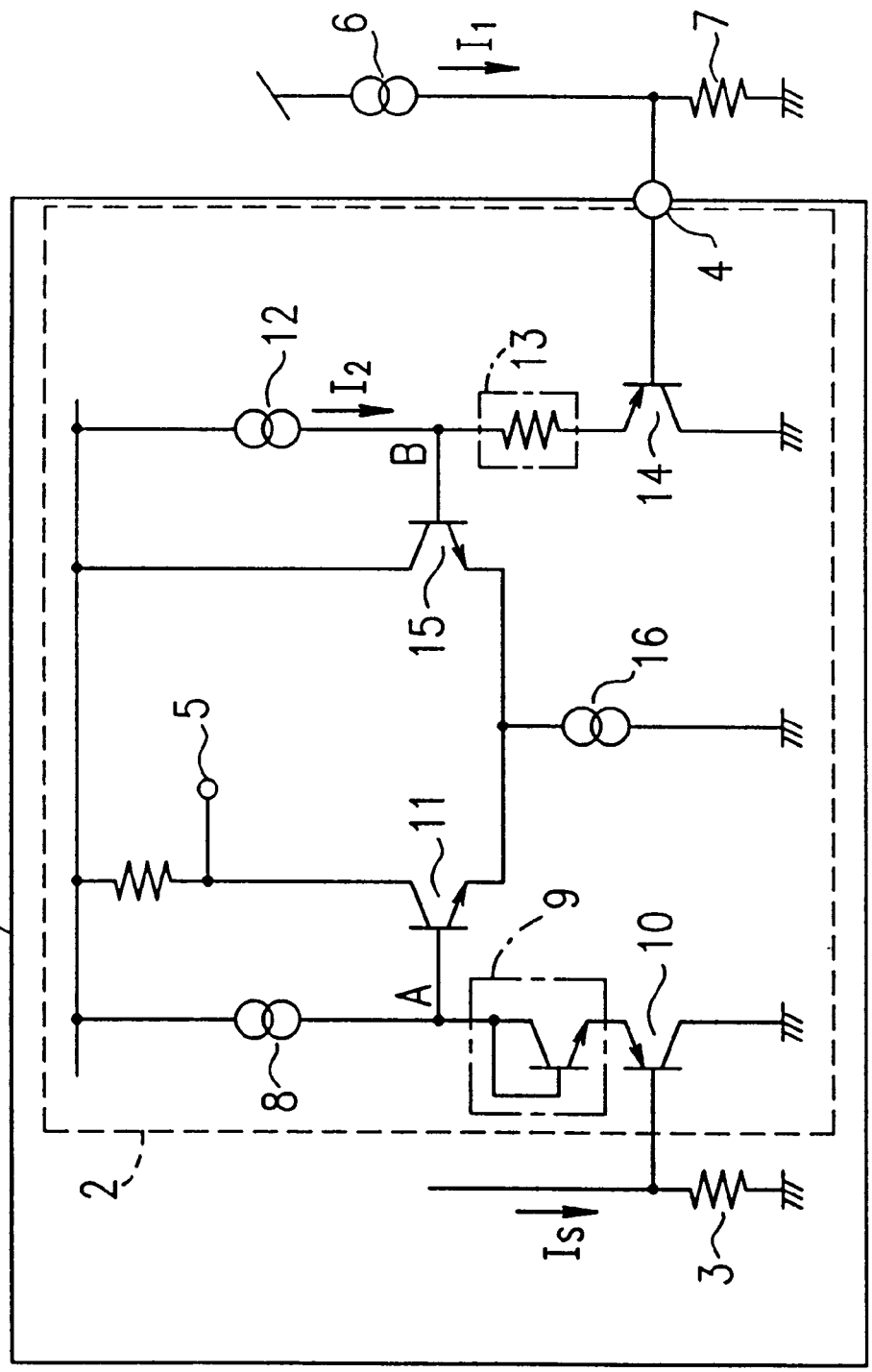
FIG. 3 is a circuit diagram of a semiconductor device according to Example 3 of the present invention.

FIG. 3 illustrates a semiconductor device according to Example 3 of the present invention.

In this example, the diode 9 is provided in the detection side circuit of the comparator 2 to which a detection voltage is supplied, while the resistor element 13 is provided in the reference side circuit of the comparator 2 to which a reference voltage is supplied.

In FIG. 3, as in Examples 1 and 2, the electric current of the constant current source 6 is denoted by $I_1$.

The base-emitter voltage and the temperature coefficient of each of the transistors 10, 11, 14 and 15 and the diode 9 are denoted by $V_F$ and $-\Delta\alpha$, respectively; and the temperature coefficient of each of the detection resistor 3 and the resistor 13 is denoted by $\Delta\beta$.

Since the temperature dependency of the external reference resistor 7 is lower than that of the detection resistor 3, the temperature coefficient of the external reference resistor 7 is assumed to be zero.

At the time when the respective voltages at points A and B in the comparator 2 are equal to each other and the output of the output terminal 5 changes from "H" to "L", the resistance value of the detection resistor 3 is denoted by $R_3$; the detection current flowing through the detection resistor 3 is; denoted by Is; the electric current of the constant current source 12 is denoted by $I_2$; the resistance value of the external reference resistor 7 is denoted by $R_7$; and the resistance value of the external reference resistor 13 is denoted by $R_{13}$.

Then, the respective voltages $V_a$ and $V_b$ at points A and B can be expressed as follows.

Expression 7

$$V_a = Is \cdot (1+\Delta\beta)R_3 + 2(1-\Delta\alpha)V_F$$

Expression 8

$$V_b = I_1 \cdot R_7 + (1-\Delta\alpha)V_F + I_2 \cdot (1+\Delta\beta)R_{13}$$

From Expressions 7 and 8, the detection current Is can be expressed as follows.

Expression 9

$$Is = \{I_1 \cdot R_7 + I_2 \cdot (1+\Delta\beta)R_{13} - (1-\Delta\alpha)V_F\} / \{(1+\Delta\beta)R_3\}$$

As the temperature increases, the denominator $(1+\Delta\beta)R_3$ in the right side in Expression 9 increases, and $I_2 \cdot (1+\Delta\beta)R_{13}$ in the numerator in the right side also increases while $(1-\Delta\alpha)V_F$ in the numerator in the right side decreases, thereby increasing the numerator in the right side as a whole. As a result, the deviation in the detection current Is due to increasing temperature is reduced.

EXAMPLE 4

Figure 4:
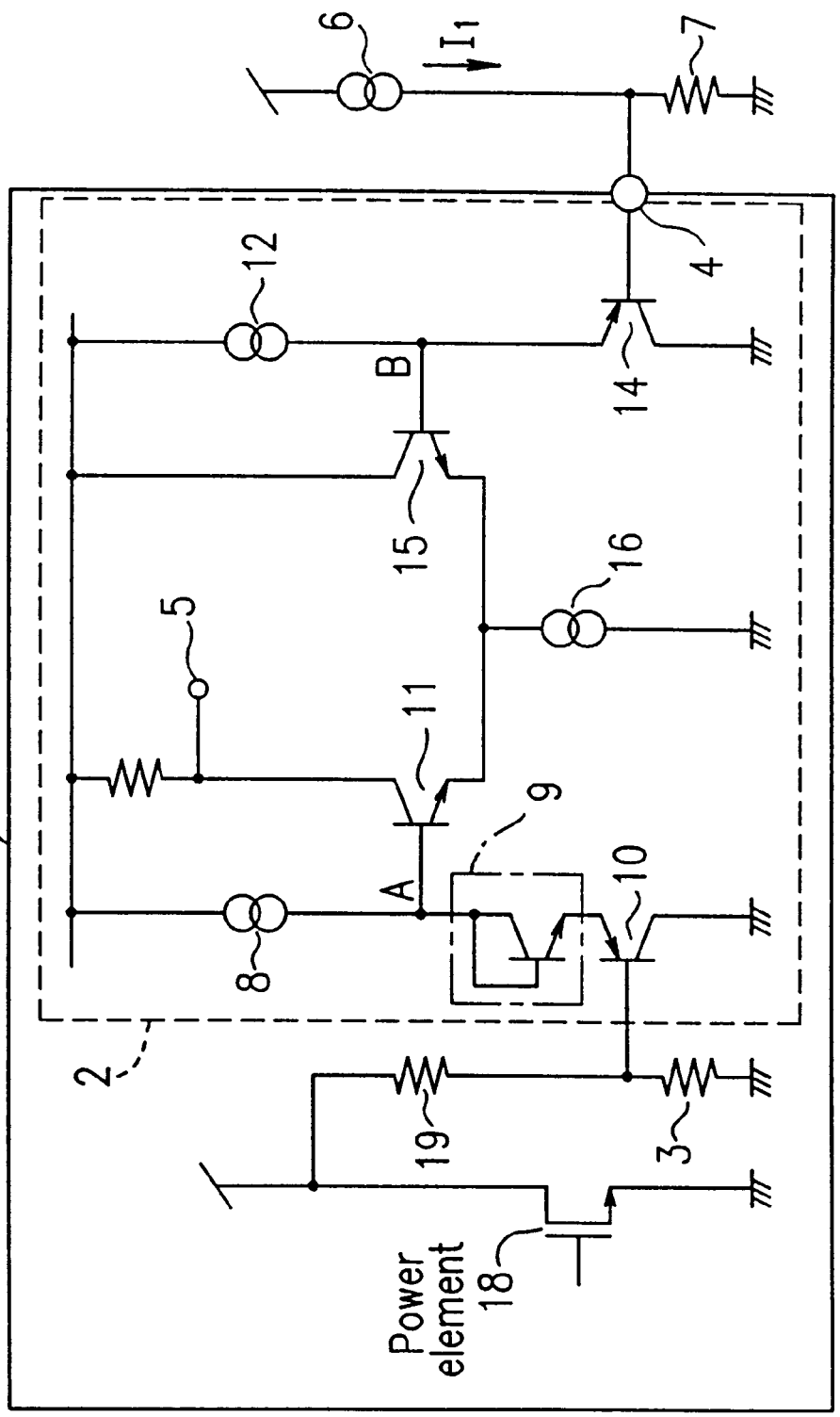
FIG. 4 is a circuit diagram of a semiconductor device according to Example 4 of the present invention.

FIG. 4 illustrates a semiconductor device according to Example 4 of the present invention. A semiconductor device 17 in this example includes therein: a power element 18; the comparator 2 which functions as a comparator for detecting an excess current of the power element 18; the detection resistor 3; and a resistor 19. In FIG. 4, elements which are illustrated in FIG. 1 are denoted by the same reference numerals.

In FIG. 4, the comparator 2 acts as a comparator for detecting an excess current of the power element 18. Except that the comparator 2 is integrated with the power element 18, the present example is the same as Example 1 as a means for reducing the difference in temperature characteristic between the detection voltage and the reference voltage.

The base-emitter voltage and the temperature coefficient of each of the transistors 10, 11, 14 and 15 and the diode 9 are denoted by $V_F$ and $-\Delta\alpha$, respectively; the temperature coefficient of the detection resistor 3 is denoted by $\Delta\beta$; the ON-resistance and the temperature coefficient of the power element 18 are denoted by Ron and $\Delta\gamma$, respectively; and the resistance value of the detection resistor 3 is denoted by $R_3$.

Since the temperature dependency of the external reference resistor 7 is lower than that of the detection resistor 3, the temperature coefficient of the external reference resistor 7 is assumed to be zero.

At the time when the respective voltages at points A and B in the comparator 2 are equal to each other and the output of the output terminal 5 changes from "H" to "L", the excess current flowing through the power element 18 is denoted by Ioc1; the resistance value of the external reference resistor 7 is denoted by $R_7$; and the resistance value of the external reference resistor 19 is denoted by $R_{19}$.

Then, the respective voltages $V_a$ and $V_b$ at points A and B can be expressed as follows.

Expression 10

$$V_a = Ioc1 \cdot (1+\Delta\gamma) Ron \cdot R_3 / (R_3 + R_{19}) + 2(1-\Delta\alpha) V_F$$

Expression 11

$$V_b = I_1 \cdot R_7 + (1-\Delta\alpha) V_F$$

From Expressions 10 and 11, the excess current Ioc1 can be expressed as follows.

Expression 12

$$Ioc1 = (R_3 + R_{19}) \cdot \{I_1 \cdot R_7 - (1-\Delta\alpha) V_F\} / \{R_3 \cdot (1\Delta\gamma) Ron\}$$

As the temperature increases, the denominator $R_3 \cdot (1+\Delta\gamma)$ Ron in the right side in Expression 12 increases, and $(1-\Delta\alpha)V_F$ in the numerator in the right side decreases while the numerator in the right side as a whole increases. As a result, the deviation in the detection current Ioc1 due to increasing temperature is reduced.

EXAMPLE 5

Figure 5:
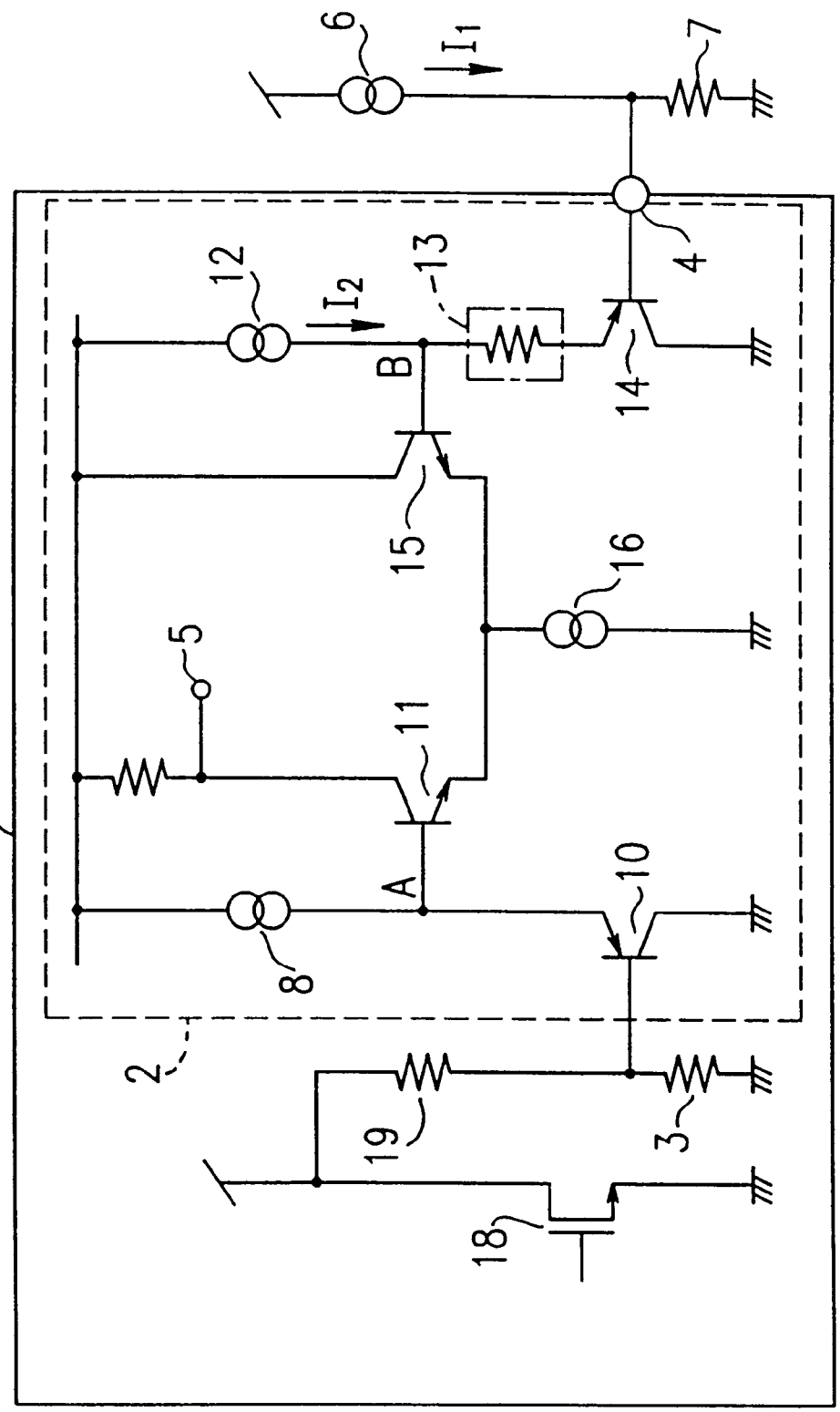
FIG. 5 is a circuit diagram of a semiconductor device according to Example 5 of the present invention.

FIG. 5 illustrates a semiconductor device according to Example 5 of the present invention. Instead of the diode 9 in FIG. 4, the resistor element 13 is provided in the reference side circuit of the comparator 2.

In FIG. 5, the comparator 2 acts as a comparator for detecting an excess current of the power element 18. Except that the comparator 2 is integrated with the power element 18, the present example is the same as Example 2 as a means for reducing the difference in temperature characteristic between the detection voltage and the reference voltage.

The base-emitter voltage and the temperature coefficient of each of the transistors 10, 11, 14 and 15 are denoted by $V_F$ and $-\Delta\alpha$, respectively; the temperature coefficient of the detection resistor 3 is denoted by $\Delta\beta$; the ON-resistance and the temperature coefficient of the power element 18 are denoted by Ron and $\Delta\gamma$, respectively; and the resistance value of the detection resistor 3 is denoted by $R_3$.

Since the temperature dependency of the external reference resistor 7 is lower than that of the detection resistor 3, the temperature coefficient of the external reference resistor 7 is assumed to be zero.

At the time when the respective voltages at points A and B in the comparator 2 are equal to each other and the output of the output terminal 5 changes from "H" to "L", the excess current flowing through the power element 18 is denoted by Ioc1; the electric current of the constant current source 12 is denoted by $I_2$; the resistance value of the external reference resistor 7 is denoted by $R_7$; the resistance value of the resistor 13 is denoted by $R_{13}$; and the resistance value of the resistor 19 is denoted by $R_{19}$.

Then, the respective voltages $V_a$ and $V_b$ at points A and B can be expressed as follows.

Expression 13

$$V_a = Ioc1 \cdot (1+\Delta\gamma) Ron \cdot R_3 / (R_3 + R_{19}) + (1-\Delta\alpha) V_F$$

Expression 14

$$V_b = I_1 \cdot R_7 + (1-\Delta\alpha) V_F + I_2 \cdot (1+\Delta\beta) R_{13}$$

From Expressions 13 and 14, the excess current Ioc1 can be expressed as follows.

Expression 15

$$Ioc1 = (R_3 + R_{19}) \cdot \{I_1 \cdot R_7 + I_2 \cdot (1+\Delta\beta) R_{13}\} / \{R_3 \cdot (1+\Delta\gamma) Ron\}$$

As the temperature increases, the denominator $R_3 \cdot (1+\Delta\gamma)$ Ron in the right side in Expression 15 increases, and $I_2 \cdot (1+\Delta\beta) R_{13}$ in the numerator in the right side also increases while the numerator in the right side as a whole increases. As a result, the deviation in the detection current Ioc1 due to increasing temperature is reduced.

EXAMPLE 6

Figure 6:
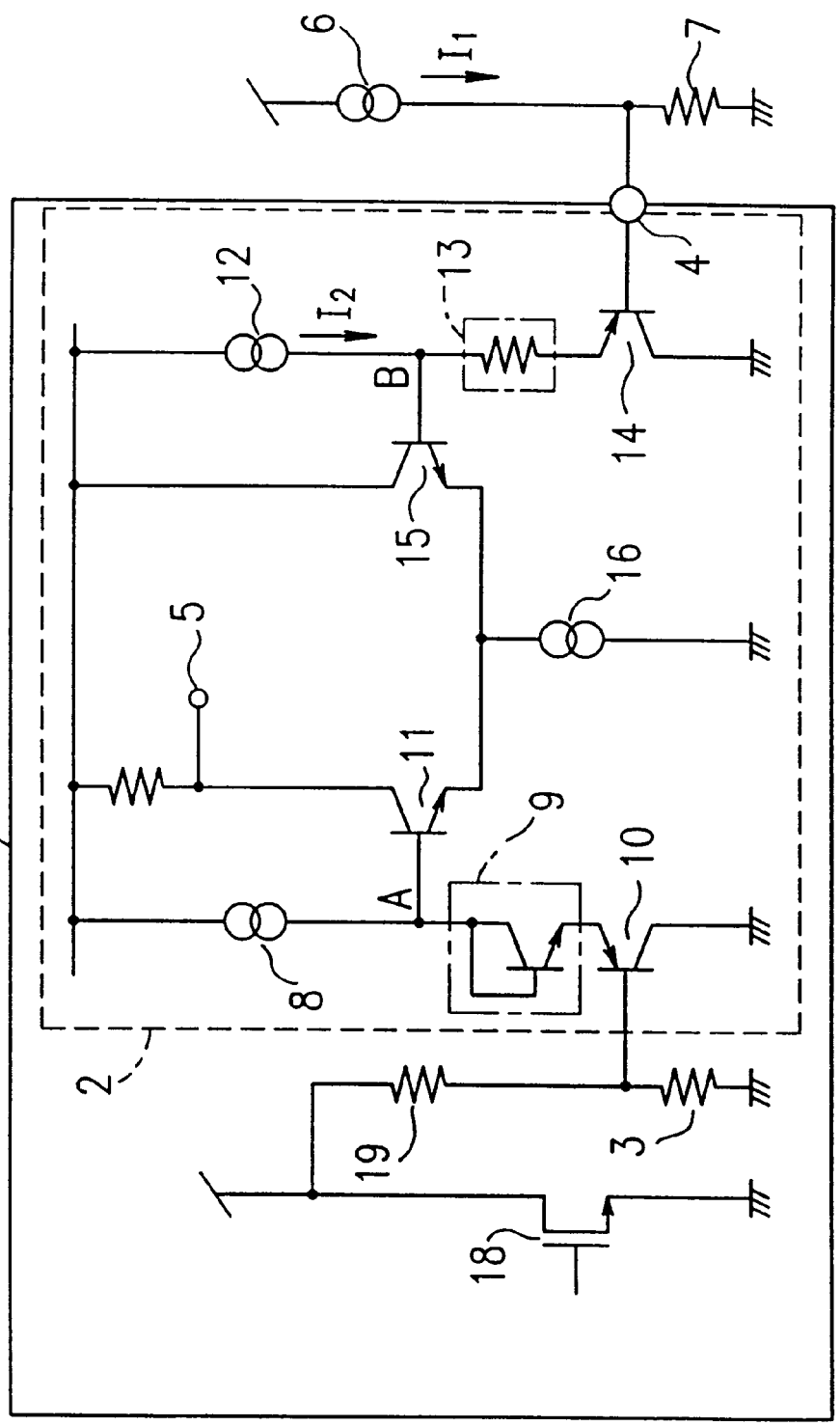
FIG. 6 is a circuit diagram of a semiconductor device according to Example 6 of the present invention.

FIG. 6 illustrates a semiconductor device according to Example 6 of the present invention. In this example, the diode 9 is provided in the detection side circuit of the comparator 2, while the resistor element 13 is provided in the reference side circuit thereof. The comparator 2 acts as a comparator for detecting an excess current of the power element 18. Except that the comparator is integrated with the power element, the present example is the same as Example 3 as a means for reducing the deviation in temperature characteristic between the detection voltage and the reference voltage.

The base-emitter voltage and the temperature coefficient of each of the transistors 10, 11, 14 and 15 and the diode 9 are denoted by $V_F$ and $-\Delta\alpha$, respectively; the temperature coefficient of the detection resistor 3 is denoted by $\Delta\beta$; and the ON-resistance and the temperature coefficient of the power element 18 are denoted by Ron and $\Delta\gamma$, respectively.

Since the temperature dependency of the external reference resistor 7 is lower than that of the detection resistor 3, the temperature coefficient of the external reference resistor 7 is assumed to be zero.

At the time when the respective voltages at points A and B in the comparator 2 are equal to each other and the output of the output terminal 5 changes from "H" to "L", the excess current flowing through the power element 18 is denoted by Ioc1; the electric current of the constant current source 12 is denoted by $I_2$; the resistance value of the external reference resistor 7 is denoted by $R_7$; the resistance value of the resistor 13 is denoted by $R_{13}$; and the resistance value of the resistor 19 is denoted by $R_{19}$.

Then, the respective voltages $V_a$ and $V_b$ at points A and B can be expressed as follows.

Expression 16

$$V_a = Ioc1 \cdot (1+\Delta\gamma) Ron \cdot R_3 / (R_3 + R_{19}) + 2(1-\Delta\alpha) V_F$$

Expression 17

$$V_b = I_1 \cdot R_7 + (1-\Delta\alpha)V_F + I_2 \cdot (1+\Delta\beta)R_{13}$$

From Expressions 16 and 17, the excess current Ioc1 can be expressed as follows.

Expression 18

$$Ioc1 = (R_3 + R_{19})/\{R_3 \cdot (1+\Delta\gamma)Ron\} \cdot \{I_1 \cdot R_7 + I_2 \cdot (1+\Delta\beta)R_{13} - (1-\Delta\alpha)V_F\}$$

As the temperature increases, the denominator $R_3 \cdot (1+\Delta\gamma)$ Ron in the right side in Expression 18 increases, and $I_2 \cdot (1+\Delta\beta)R_{13}$ in the numerator in the right side also increases while $(1-\Delta\alpha)V_F$ in the numerator in the right side decreases, thereby increasing the numerator in the right side as a whole. As a result, the deviation in the detection current Ioc1 due to increasing temperature is reduced.

Note that, even when the temperature characteristic of the detection element of the comparator by which a detection voltage is generated is different from that of the reference element by which a reference voltage is generated, it is possible to suppress the fluctuations in the output characteristic of the comparator due to temperature changes. Moreover, it is possible to obtain a 4-terminal device of a power element including a comparator and a detection element provided therein. Normally, such a device is used and sold as a 5-terminal device. It is possible to increase the number of external terminals, making use of other functions.

As described above, according to the present invention, the output characteristic of the comparator can be set arbitrarily. Therefore, the present invention provides the following effect in a semiconductor device in which the reference voltage of the comparator is supplied from an externally provided component via an external connection terminal. That is, by providing a temperature dependent adjustment element in at least one of the detection side circuit or the reference side circuit of the comparator, it is possible to reduce the temperature characteristic difference between the detection voltage and the reference voltage independently of the temperature characteristic of a semiconductor device which is connected to the comparator.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device, comprising:

a comparator including a detection side circuit to which a detection voltage is supplied and a reference side circuit to which a reference voltage is supplied; and a detection element for obtaining the detection voltage provided inside the semiconductor device, and a reference element for obtaining the reference voltage provided outside the semiconductor device;

wherein at least one of the detection side circuit and the reference side circuit includes a temperature dependent adjustment element for reducing a difference between a temperature characteristic of the detection voltage and a temperature characteristic of the reference voltage, the detection side circuit includes a first differential element having a first input to which a voltage based on the detection voltage is provided, and the reference side circuit includes a second differential element having a second input to which a voltage based on the reference voltage is supplied, and the temperature dependent adjustment element is connected to at least one of the first input and the second input.

2. A semiconductor device, comprising:

a comparator including a detection side circuit to which a detection voltage is supplied and a reference side circuit to which a reference voltage is supplied; and a detection element for obtaining the detection voltage provided inside the semiconductor device, and a reference element for obtaining the reference voltage provided outside the semiconductor device;

wherein at least one of the detection side circuit and the reference side circuit includes a temperature dependent adjustment element for reducing a difference between a temperature characteristic of the detection voltage and a temperature characteristic of the reference voltage, the detection side circuit includes a first buffer element and a first differential element, and the reference side circuit includes a second buffer element and a second differential element; and the temperature dependent adjustment element is provided between the first buffer element and the first differential element or between the second buffer element and the second differential element.

3. A semiconductor device according to claim 1, wherein the detection side circuit includes the temperature dependent adjustment element, the temperature dependent adjustment element having a characteristic such that a voltage between opposite ends of the temperature dependent adjustment element decreases as temperature increases.

4. A semiconductor device according to claim 3, wherein the temperature dependent adjustment element is a diode.

5. A semiconductor device according to claim 1, wherein the reference side circuit includes the temperature dependent adjustment element, the temperature dependent adjustment element having a characteristic such that a voltage between opposite ends of the temperature dependent adjustment element increases as temperature increases.

6. A semiconductor device according to claim 5, wherein the temperature dependent adjustment element is a resistor element.

7. A semiconductor device according to claim 1, wherein the semiconductor device further includes a power element, and the detection side circuit further includes a detection circuit for detecting an excess current or heat generation of the power element.

8. A semiconductor device according to claim 1, wherein the reference element is provided outside the semiconductor device so that an output characteristic of the comparator is variable.

* * * * *